Feb. 13, 1962 P. N. OAKES ETAL 3,021,461

SEMICONDUCTOR DEVICE

Filed Sept. 10, 1958

INVENTORS:
PHILIP N. OAKES,
RONALD N. WILKES,
BY Julius J. Zaskalicky
THEIR ATTORNEY.

United States Patent Office 3,021,461

Patented Feb. 13, 1962

3,021,461

SEMICONDUCTOR DEVICE

Philip Noel Oakes and Ronald Neil Wilkes, Syracuse, N.Y., assignors to General Electric Company, a corporation of New York Filed Sept. 10, 1958, Ser. No. 760,137
10 Claims. (Cl. 317—235)

Figure 1:
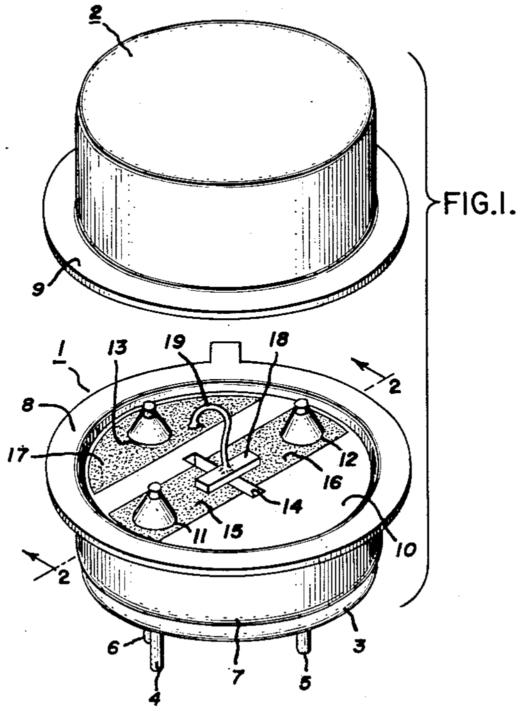

The present invention relates generally to semi-conductor devices and more particularly to mountings for the active semiconductive members or bodies of such devices.

Heretofore, the active semiconductor members of semiconductor devices have been mounted on and supported between conductors extending from header portions of the devices. When such devices are subjected to vibration, forces set up in the supporting conductors frequently cause fracturing of the fragile semiconductor members which are usually of rather small size, for example, of the order of .005 inch by .008 inch by .09 inch. Also, with such mountings the heat developed in the semiconductor members is dissipated essentially only through supporting conductors of restricted dimensions. Thus the operating capabilities of such devices are limited. Furthermore, the electrode supporting structure in order to accommodate such semi-conductor members has to be held to close dimensional tolerances and generally occupies considerable overall space.

The present invention is directed to overcoming disadvantages such as set forth above in prior art mountings for semiconductor members.

Accordingly, an object of the present invention is to provide improvements in mounting structures for bar-shaped semiconductive bodies.

Another object of the present invention is to provide a mounting structure which is mechanically rugged and is able to withstand vibrations and impacts far exceeding those which prior art mounting structures are able to withstand.

Still another object of the present invention is to provide a mounting structure which readily disspiates the heat developed in the semiconductor member of the device.

A further object of the present invention is to provide a simple mounting structure for the active elements of semiconductor devices whereby the assembly procedures for fabricating such devices are simplified and the cost thereof is reduced.

A still further object of the present invention is to provide a mounting structure which need not be held to close tolerances, yet which is suitable to receive semiconductive bodies of widely varying dimensions.

In carrying out the invention in one illustrative form, there is provided a block of insulating material having a plurality of spaced conductive areas thereon. A bar of semiconductor material constituting the active element of the device is conductively secured at each end thereof to a respective conductive area and a conductive connection is made from a third active region of the device to another conductive area. Means are provided for making electrical connections to the conductive areas.

Figure 2:
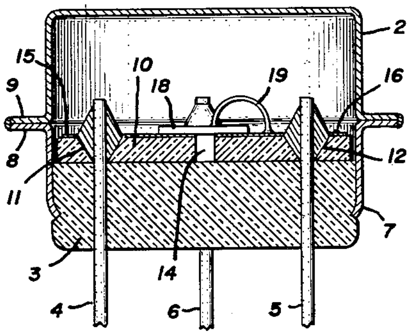

The features of this invention which are believed to be novel are set forth with particularity in the appended claims. The invention itself, however, both as to its organization and method of operation, together with further objects and advantages thereof may best be understood by reference to the following description taken in connection with the accompanying drawings, in which:

FIGURE 1 is a perspective view of a semiconductor device partly disassembled showing the mounting structure of the present invention; and FIGURE 2 is a side view, in section, of the assembled device of FIGURE 1 taken along section 2—2 of FIGURE 1.

Referring now to FIGURES 1 and 2, the device shown comprises a header assembly 1 and a cap member 2 which, upon completion of fabrication of the header, may be assembled by welding or soldering of the mating flange portions thereof. The header member 1 comprises an insulating base portion 3 in which are embedded conductive leads 4, 5 and 6 and which is surrounded by a cylindrical conductive member 7 having a flange portion 8 adapted to engage flange portion 9 of the cap 2.

An insulating platform or block 10 is provided as part of the header assembly. The platform 10 may be made of any suitable insulating material such as ceramic or glass and is provided with a plurality of holes 11, 12 and 13 extending therethrough from major face to major face and, in addition, is provided with a centrally located slot 14. One major surface of the platform is also provided with a plurality of metalized areas 15, 16 and 17, two of which are contiguous to the slot and each of which adjoins a respective hole.

A bar of semiconductor material 18 is conductively secured at its ends to metalized areas contiguous with the slot by means of a suitable solder. A flexible wire-like conductor 19 is fused to an intermediate portion of the bar and soldered to metalized area 17. Ceramic block 10 is securely held in place on insulating base portion 3 by a solder bond between the leads and the metalized portions. The holes 11, 12 and 13 may be tapered as shown to receive suitable solder and to secure the ceramic member 10 to the insulating base 3. If desired, suitable externally disposed contacts may be made with the various metalized areas of the block 10 and the block 10 suitably encapsulated to form a unitary device.

The contact areas 15, 16 and 17 of the platform 10 may be metalized by any of a variety of ways, for example, the metalizing technique disclosed in U.S. Patent 2,667,427, would be suitable for metalizing the ceramic base member. Metalized areas may be provided on the base member by other suitable means, such as spraying, vaporizing, etc. Preferably, metalized portions are constituted of a material adapted to make a good mechanical and electrical bond to the semiconductor bar. If conductive connection is to be made to a bar of semiconductor material of N-type conductivity, a solder suitable for forming ohmic contact to the bar is used. Gold is a good solder material. If the bar of semiconductor material is of N-type conductivity, a very small percentage of antimony alloyed with the gold assures the formation of an ohmic contact. For example, a gold-antimony metalized surface consisting of 99% gold and 1% antimony would be suitable for this purpose.

The device shown in FIGURE 1 is a unijunction transistor such as described and claimed in U.S. Patent 2,769,-926. Such a device comprises a bar of semiconductor material, for example silicon, of either N or P-type conductivity. For the purposes of illustration, it is assumed that a bar of N-type conductivity is used. In such a case, the metalized areas 15 and 16 would advantageously be formed of the gold-antimony alloy mentioned above. If a P-type bar were used, the metalized surface would be made of a suitable alloy, such as gold-aluminum alloy, 99% gold and 1% aluminum. The bar is placed on the metalized areas to span the slot 14. The presence of the slot assures separation of the conductive areas 15 and 16. The ceramic member 10 is then heated, causing the metalized areas 15 and 16 to partially fuse and bond the bar to the metalized areas. Thereafter, a wire of aluminum, a P-type conductivtiy-inducing material, is placed adjacent one edge of the slot, heated to cause alloying and recrystallizing of the wire with the silicon to form a P-type conductivity region therein. The other end of the wire is then soldered to the conductive area 17. It will be apparent that very little expense and effort goes into mounting the semiconductor bar on the insulating base with conductive connections to the various regions of the bar. The assembly may be tested at this point and if defective, it may be discarded before mounting on the header element itself with the result that considerable expense may be avoided. Next, the platform is mounted in the header with the holes in the platform registering with the leads of the header. Solder is then applied to make good mechanical and electrical bond between the leads and the conductive areas.

Though one form of the invention has been described in connection with a unijunction transistor, it will be apparent that other semiconductor devices, such as conventional transistors, transistor tetrodes, diodes, etc., may be readily mounted. In conventional transistors, the bar is mounted so that the base region thereof registers with the slot and is free of contact of the metalized end areas adjacent thereto. Conductive connection is made to the emitter, collector and base regions of the transistor in a manner similar to the manner used for making connections to the end and intermediate regions of the unijunction transistor. If it is desired to make more than three connections to the transistor, additional holes and the metalized areas may be provided. While the metalized insulating base member has been described as ceramic, glass or any other suitable insulating material to which conductive contacts may be secured may be used. Preferably the base member should be a relatively good heat conductor as well as a good insulator. Ceramic materials such as beryllium would meet these requirements.

The structures described in FIGURES 1 and 2 are structures which are mechanically simple and easy to fabricate. They are structures which are mechanically rugged and are able to withstand tremendous shocks. The insulating base member essentially forms a backing for the fragile semiconductor members and, in addition, being in good mechanical and conductive contact with large metalized areas, good heat flow from the heat generating parts of the semiconductor devices are assured, thereby extending the operating range of the device itself. With such a mounting, transistor bars need not be held to such close over-all tolerances and, in addition, in view of the flush mounting of the bars to the ceramic base supporting member itself, the overall dimensions of the completed device are kept to a minimum.

While specific embodiments have been shown and described, it will, of course, be understood that various modifications may be devised by those skilled in the art which will embody the principles of the invention and found in the true spirit and scope thereof.

What I claim as new and desire to secure by Letters Patent of the United States is:

1. A semiconductive device comprising a block of insulating material having a plurality of spaced conductive areas thereon, a bar of semiconductor material having a pair of end portions each conductively mounted on and secured to one of said conductive areas, an intermediate portion of said bar in flexible conductive contact to a third of said areas, and means for making electrical connections to said conductive areas.

2. A semiconductor device comprising a platform of insulating material having a conductive strip secured thereon and separated into two parts by a slot in said platform, a bar of semiconductive material having a pair of end portions each conductively secured to a respective one of said parts, and means for making electrical connections to parts of said conductive strip.

3. A semiconductor device comprising a platform of insulating material having a slot therein, a plurality of spaced conductive areas on a major surface of said platform, two of said areas contiguous with said slot, a bar of semiconductor material having end portions each of which is mounted to a respective one of said two areas, an intermediate portion of said bar conductively connected to a third of said areas, and means for making electrical connections to said conductive areas.

4. A semiconductor device comprising a generally planar base member having a plurality of leads extending therethrough substantially perpendicular to the major faces of said base member, a platform of insulating material having plurality of holes extending therethrough from major face to major face positioned on said base member with said holes registering with said leads, a plurality of spaced conductive areas on the major face of said platform remote from said base member, a bar of semiconductor material having a pair of end portions each conductively secured to a respective one of said conductive areas, and means for conductively securing each of said leads to a corresponding conductive area.

5. A semiconductor device comprising a generally planar base member having a pair of leads extending therethrough substantially perpendicular to the major face of said base member, a platform of insulating material having a slot therein and having a pair of holes extending therethrough from major face to major face positioned on said base member with said holes registering with said leads, a pair of spaced conductive areas on the major surface of said platform remote from said base and contiguous with said slot, a bar of semiconductor material having a pair of end portions each conductively secured to a respective one of said conductive areas, and means for conductively securing each of said leads with a corresponding conductive area.

6. A semiconductor device comprising a generally planar base member having a plurality of leads extending therethrough substantially perpendicular to the major faces of said base member, a platform of insulating material having a slot therein and having a plurality of holes extending therethrough from major face to major face positioned on said base member with said holes registering with said leads, a plurality of spaced conductive areas on the major surface of said platform remote from said base, two of said areas contiguous with said slot, a bar of semiconductor material having a pair of end portions each conductively secured to a respective one of said conductive areas contiguous with said slot, and means for conductively securing each of said leads with a corresponding conductive area.

7. A semiconductor device comprising a generally planar base member having a plurality of leads extending therethrough substantially perpendicular to the major faces of said base member, a platform of insulating material having a plurality of holes extending therethrough from major face to major face positioned on said base member with said holes registering with said leads, a plurality of spaced conductive areas on the major face of said platform remote from said base member, each of said spaced conductive areas contiguous with a respective hole, a bar of semiconductor material having a pair of end portions, each conductively secured to a respective one of said conductive areas, and solder means conductively securing each of said leads to a corresponding conductive area.

8. A semiconductor device comprising a platform of insulating material having a slot therein, a pair of conductive contacts secured to said platform on each side of said slot, a bar of semiconductor material of one conductivity type having a pair of end portions, each conductively secured to a respective one of said conductive areas, an intermediate portion of the opposite conductivity type at least partially contained in the portion of said bar spanned by said slot, means for making electrical connections to said intermediate portion and said conductive areas.

9. A semiconductor device comprising a platform of insulating material having a slot therein, a pair of conductive contacts secured to said platform on each side of said slot, a bar of semiconductor material having an end collector portion, an end emitter portion and intermediate base portion, each of said collector and emitter portions secured to a respective one of said conductive areas, said base portion contained in the portion of said bar spanned by said slot and means for making electrical connections to said base portion and said conductive areas.

10. A semiconductor device comprising a platform of insulating material having a slot therein, a pair of gold solder contacts secured to said platform on each side of said slot, a bar of semiconductive material having a pair of end portions each secured to a respective one of said conductive contacts thereby, and means for making electrical connections to said conductive contacts.

References Cited in the file of this patent

UNITED STATES PATENTS

| | | |
|---|---|---|
| 1,745,175 | Lilienfeld | Jan. 28, 1930 |
| 2,486,110 | Bugel et al. | Oct. 25, 1949 |
| 2,560,594 | Pearson | July 17, 1951 |
| 2,681,993 | Shockley | June 22, 1954 |
| 2,875,385 | Fuller | Feb. 24, 1959 |
| 2,890,395 | Lathrop et al. | June 9, 1959 |